United States Patent
Guyader et al.

(10) Patent No.: US 12,057,461 B2
(45) Date of Patent: Aug. 6, 2024

(54) SPAD PIXEL

(71) Applicants: STMicroelectronics (Crolles 2) SAS, Crolles (FR); STMicroelectronics (Research & Development) Limited, Marlow (GB)

(72) Inventors: Francois Guyader, Montbonnot (GB); Sara Pellegrini, Edinburgh (GB); Bruce Rae, Edinburgh (GB)

(73) Assignees: STMicroelectronics (Crolles 2) SAS, Crolles (FR); STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 18/225,298

(22) Filed: Jul. 24, 2023

(65) Prior Publication Data
US 2023/0369359 A1 Nov. 16, 2023

Related U.S. Application Data

(63) Continuation of application No. 17/498,286, filed on Oct. 11, 2021, now Pat. No. 11,843,008.

(30) Foreign Application Priority Data

Oct. 12, 2020 (FR) ...................................... 2010400

(51) Int. Cl.
*H01L 27/146* (2006.01)
*G01J 1/44* (2006.01)
(Continued)

(52) U.S. Cl.
CPC ............ *H01L 27/1461* (2013.01); *G01J 1/44* (2013.01); *H01L 27/14634* (2013.01);
(Continued)

(58) Field of Classification Search
CPC ........... H01L 27/1461; H01L 27/14634; H01L 31/107; H01L 27/14636; H01L 27/14643;
(Continued)

(56) References Cited

U.S. PATENT DOCUMENTS 10,204,950 B1 2/2019 Yamashita
2017/0186798 A1* 6/2017 Yang ................ H01L 27/14632
(Continued)

FOREIGN PATENT DOCUMENTS

| CN | 106920808 A | 7/2017 |
|---|---|---|
| CN | 109585468 A | 4/2019 |
| CN | 217306505 U | 8/2022 |

OTHER PUBLICATIONS

INPI Search Report and Written Opinion for priority application, FR 2010400, report dated May 17, 2021 (8 pages).
(Continued)

*Primary Examiner* — Tony Ko
(74) *Attorney, Agent, or Firm* — Crowe & Dunlevy LLC (57) ABSTRACT

An electronic device includes a stack of a first level having a SPAD, a second level having a quench circuit for said SPAD, and a third level having a circuit for processing data generated by said SPAD. A method for making the device includes: a) forming of the first level; b) bonding, on the first level, by molecular bonding, of a stack of layers including a semiconductor layer; and c) forming the quench circuit of the second level in the semiconductor layer.

13 Claims, 7 Drawing Sheets

(51) Int. Cl.
*H01L 31/107* (2006.01)
*H04N 25/70* (2023.01)

(52) U.S. Cl.
CPC ........... *H01L 31/107* (2013.01); *H04N 25/70* (2023.01); *G01J 2001/4466* (2013.01)

(58) Field of Classification Search
CPC . H01L 27/1469; G01J 1/44; G01J 2001/4466; H04N 5/369
See application file for complete search history.

(56) References Cited

U.S. PATENT DOCUMENTS

| 2018/0090526 A1 | 3/2018 | Mandai et al. |
| 2018/0308881 A1 | 10/2018 | Hynecek |
| 2019/0131478 A1 | 5/2019 | Wang et al. |

OTHER PUBLICATIONS

First Office Action and Search Report for counterpart CN Appl. No. 202111185973.3, report dated May 14, 2024, 9 pgs.

\* cited by examiner

SPAD PIXEL

CROSS REFERENCE TO RELATED APPLICATIONS

This application is a continuation of U.S. patent application Ser. No. 17/498,286, filed Oct. 11, 2021, which claims the priority benefit of French Application for Patent No. 2010400, filed on Oct. 12, 2020, the contents of which are hereby incorporated by reference in their entireties to the maximum extent allowable by law.

TECHNICAL FIELD

The present disclosure generally relates to electronic devices and more particularly to devices comprising pixels based on SPADs and their manufacturing methods.

BACKGROUND

A photodiode is a semiconductor component having the ability of capturing a radiation in the optical domain and of transforming it into an electric signal.

Single photon avalanche diodes or SPADs are photodiodes. SPADs are avalanche photodiodes operated above the breakdown voltage, and a photon reaching the multiplication region may alone start an avalanche and cause the breakdown of the junction.

There is a need for SPAD pixels having a smaller surface area than current SPAD pixels.

SUMMARY

Embodiments herein overcome all or part of the disadvantages of known SPAD pixels.

One embodiment provides a method of manufacturing an electronic device comprising a stack of a first level comprising a SPAD, a second level comprising a quench circuit for said SPAD, and a third level comprising a circuit for processing data generated by said SPAD, the method comprising: a) forming the first level; b) bonding, on the first level, by molecular bonding, a stack of layers comprising a semiconductor layer; and c) forming the quench circuit of the second level in the semiconductor layer.

According to an embodiment, the second and third levels are bonded by hybrid bonding.

According to an embodiment, the semiconductor layer is etched, after step b), to form a plurality of distinct regions.

According to an embodiment, the method comprises a step of forming the third level, this step comprising: forming transistors inside and on top of a substrate; forming of a first interconnection network and forming first exposed metal pads.

According to an embodiment, the method comprises, after step c), a step of forming a second interconnection network on the quench circuit, and forming second exposed metal pads on the side of the second level opposite to the first level.

According to an embodiment, the first and second pads are capable of being placed in contact during the bonding of the second and third levels.

According to an embodiment, a surface of the first level is covered with a first layer made of an insulating material and the forming the stack of layers comprises a step of forming, on an SOI structure, a second layer made of said insulating material, the molecular bonding being performed by placing into contact the first and second insulating layers.

According to an embodiment, the method comprises forming, between the SOI structure and the second insulating layer, a conductive layer forming a ground plane.

Another embodiment provides an electronic device comprising a stack of a first level comprising a SPAD, a second level comprising a quench circuit for said SPAD, and a third circuit comprising a circuit for processing the data generated by said SPAD, wherein the first level is bonded to the second level by molecular bonding and the second level is bonded to the third level by hybrid bonding.

According to an embodiment, the first level comprises a single SPAD.

According to an embodiment, the first level comprises no electronic component other than the SPAD.

According to an embodiment, the second level only comprises a quench circuit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
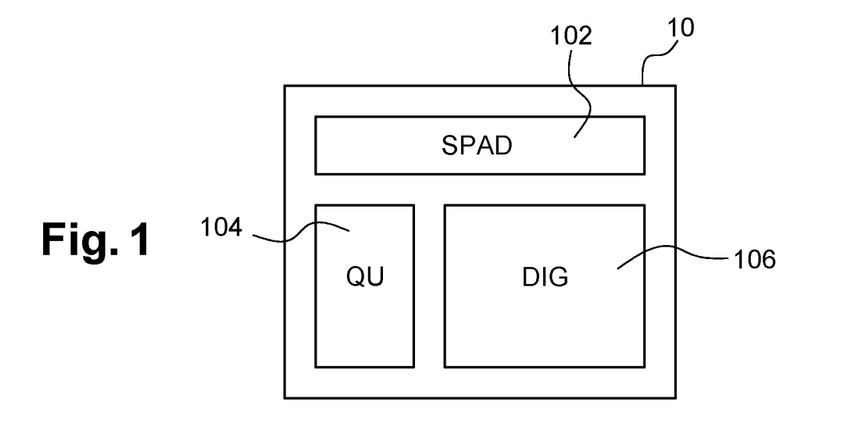
FIG. 1 shows an example of a SPAD pixel.

FIG. 1 shows an example of a SPAD pixel 10.

Pixel 10 comprises a SPAD circuit 102 configured to start an avalanche on detection of a photon. Circuit 102 preferably comprises a single SPAD.

Pixel 10 further comprises a quench circuit 104 (QU). Circuit 104 is configured to detect the current flowing through the photodiode and to turn it off by lowering the biasing of the junction below the breakdown voltage. Circuit 104 then recharges the junction by reapplying the initial voltage enabling the detection of a new photon.

Circuit 104 comprises analog components. Circuit 104 thus comprises components such as transistors, resistive elements, capacitive elements, etc.

Pixel 10 further comprises a circuit 106 (DIG), for example for processing the information generated by the SPAD. The circuit preferably is a digital circuit comprising transistors, preferably being formed of transistors only.

The composition of circuit 104, which is an analog circuit, makes its miniaturization more complex than the miniaturization of circuit 106. Thus, the decrease in the surface area of pixel 10 is limited, in particular, by the sum of the dimensions, in other words the area, of the SPAD and of circuit 104.

Figure 2:
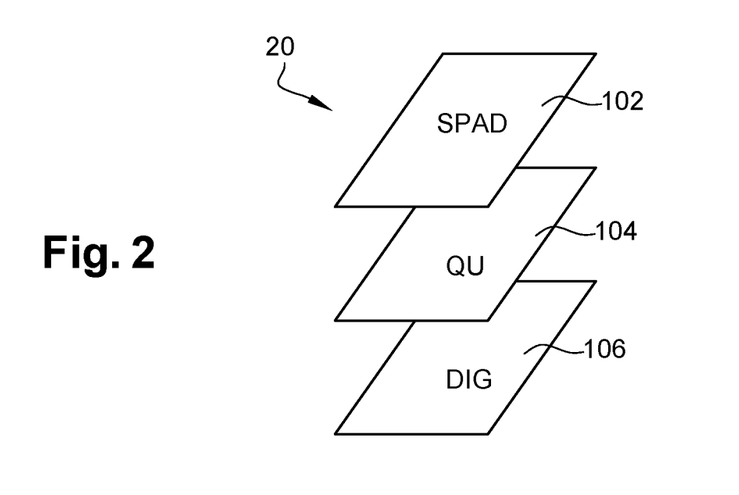
FIG. 2 very schematically shows an embodiment of a SPAD pixel.

FIG. 2 very schematically shows an embodiment of a SPAD pixel 20.

The pixel comprises, like the pixel 10 of FIG. 1, SPAD circuit 102, quench circuit 104 (QU), and circuit 106 (DIG) for processing the obtained information.

In the embodiment of FIG. 2, SPAD circuit 102 and circuits 104 and 106 are stacked on one another. Thus, circuit 102 rests on circuit 104 and circuit 104 rests on circuit 106.

Pixel 20 thus comprises three stacked levels. The upper level of the stack is the level only comprising SPAD circuit 102. The lower level is the level comprising, preferably only comprising, circuit 106 for processing the information generated by the SPAD. The intermediate level, located between the upper and lower levels, preferably only comprises quench circuit 104. Thus, the components of the quench circuit are not located in upper level 102 or in lower level 106. Similarly, the elements of circuit 106 are not located in the upper level or in the intermediate level.

Preferably, the upper level comprises a single SPAD. Preferably, the upper level comprises no electronic components, in particular, no transistor, no capacitor, no resistor, etc. Preferably, the intermediate level comprises a single quench circuit, configured to operate with the single SPAD of the upper level. Preferably, the lower level comprises a data processing circuit configured to only process data generated by the single SPAD of the upper level. Preferably, the pixel 20, in other words the SPAD circuit 102, the quench circuit 104, and the circuit 106 for processing the obtained information comprises only elements related to the SPAD. In other words, no electronical element, for example no electronical circuit, unrelated to the SPAD is located in the pixel 20.

The surface area of circuit 20 is thus only limited by the circuit having the largest surface area among circuits 102, 104, and 106.

Figure 3:
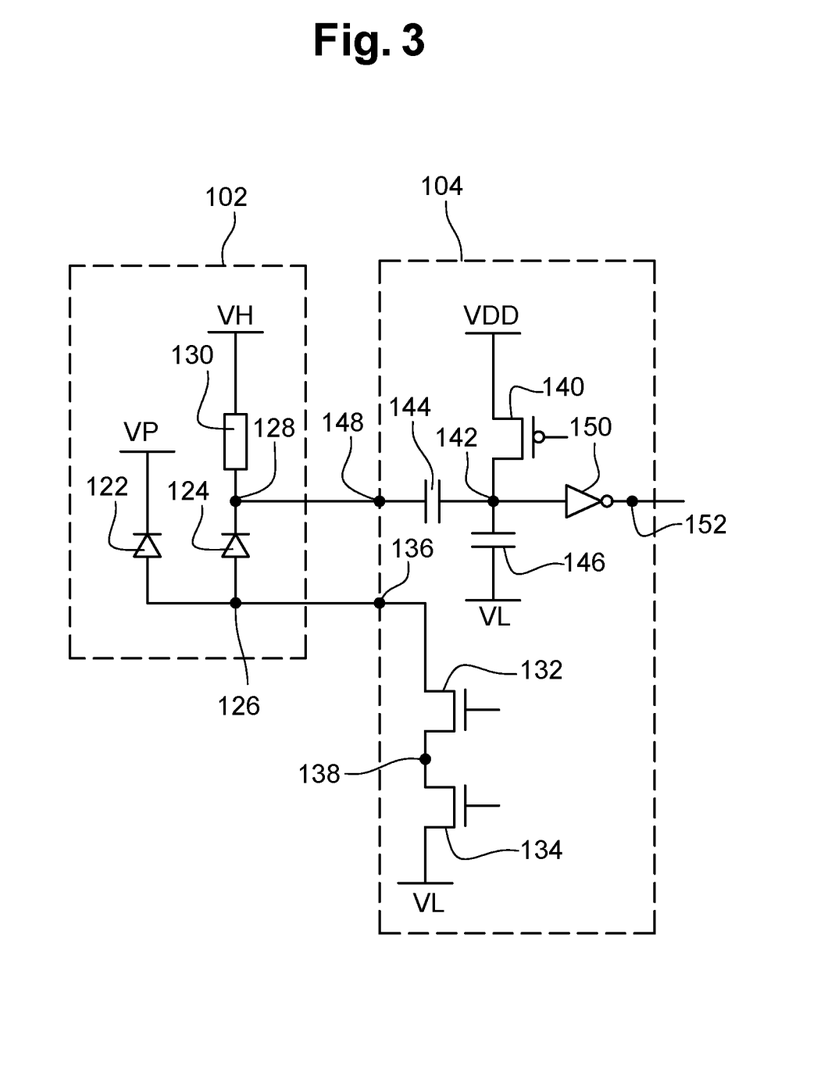
FIG. 3 shows an example of a portion of a SPAD pixel.

FIG. 3 shows an example of a portion of a SPAD pixel. More particularly, FIG. 3 shows an example of a SPAD circuit 102 and an example of a quench circuit 104.

Circuit 102 comprises, in the example of FIG. 3, a protection diode 122 and a SPAD photodiode 124. Diode 122 is a so-called "pull-up" diode. Diode 122 is coupled, preferably connected, between a node of application of a voltage VP and a node 126. The cathode of diode 122 is coupled, preferably connected, to node 126 and the anode of diode 122 is coupled, preferably connected, to the node of application of voltage VP. The diode 122 is a disabling diode, allowing the node of the anode of the SPAD 124 to be held at a voltage value for example equal to 7 V when the SPAD diode is disabled by a transistor 132. The disabling voltage VP has a value for example at least 2 V larger than the excess bias applied to the SPAD beyond the breakdown voltage SPAD 124 is coupled, preferably connected, between node 126 and a node 128. The cathode of SPAD 128 is coupled, preferably connected, to node 128 and the anode of cathode 124 is coupled, preferably connected, to node 126. Circuit 102 further comprises a resistor 130 coupled, preferably connected, between node 128 and a node of application of a voltage VH.

Circuit 104, corresponding to the quench circuit, comprises transistors 132 and a transistor 134 coupled, preferably connected, in series between a node 136 and a node of application of a voltage VL, for example, the ground. More particularly, transistor 132 is coupled, preferably connected, by its conduction terminals (for example, source and drain) between node 136 and a node 138. Transistor 134 is coupled, preferably connected, by its conduction terminals between node 138 and the node of application of voltage VL.

Transistors 132 and 134 are preferably N-type field-effect (MOS) transistors.

Circuit 104 further comprises a transistor 140 coupled, preferably connected, by its conduction terminals between a node 142 and a node of application of a power supply voltage VDD. Transistor 140 preferably is a P-type field effect transistor. Circuit 104 further comprises capacitive elements or capacitors 144 and 146. Capacitor 144 is coupled, preferably connected, between node 142 and a node 148. Capacitor 146 is coupled, preferably connected, between node 142 and a node of application of voltage VL. Circuit 104 also comprises an inverter circuit 150 coupled, preferably connected, between node 142 and a node 152.

Circuit 102 is located on the upper level and circuit 104 is located in the intermediate level of the pixel 20 of FIG. 2. Node 128 of the upper level is coupled, preferably connected, to node 148 of the intermediate level. Node 152 is preferably coupled, preferably connected, to a node, not shown, of the lower level. Node 126 of the upper level is coupled, preferably connected, to node 136 of the intermediate level. The links between nodes 126 and 128 and, respectively nodes 136 and 148 correspond to connections between levels, for example achieved via conductive tracks, conductive vias, and contact pads. The links between the different levels will be described in further detail in the embodiments of FIGS. 4 and 5.

Figure 4:
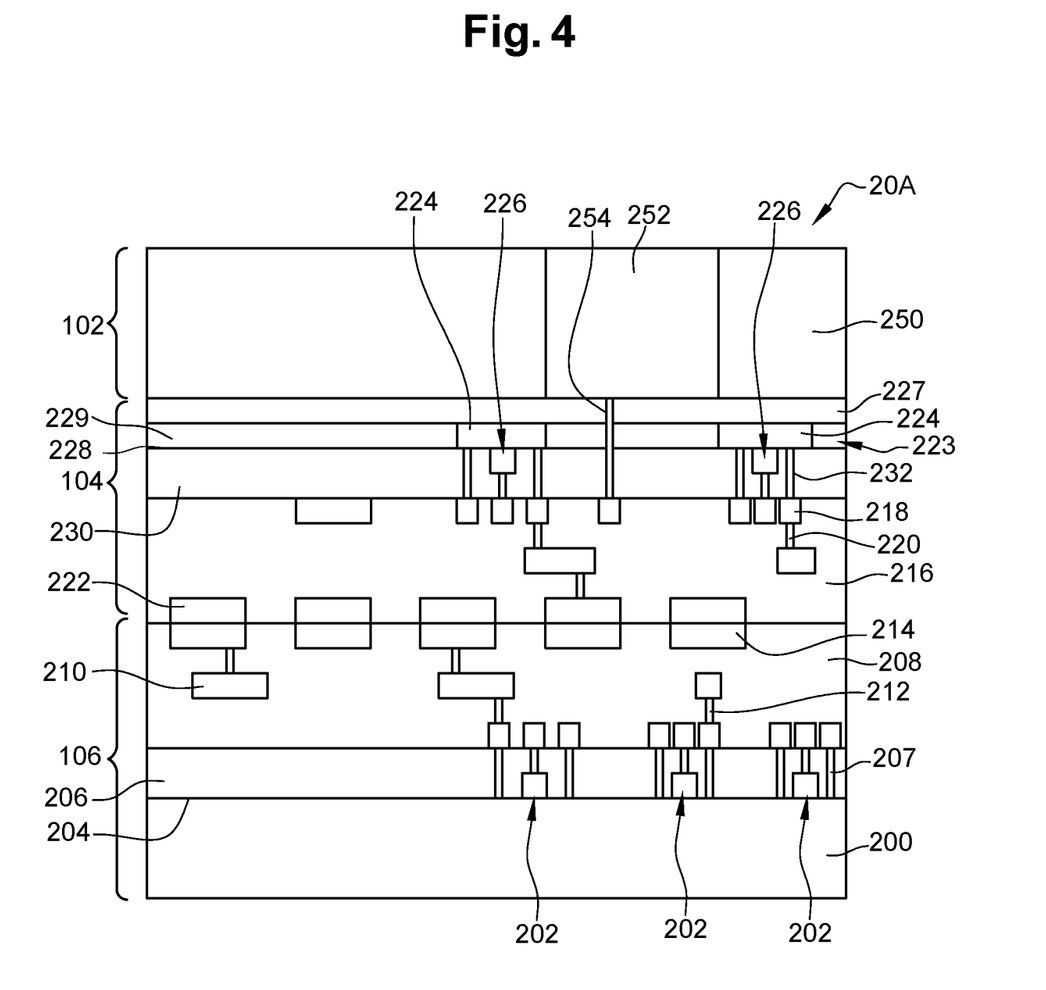
FIG. 4 is a cross-section view schematically illustrating an embodiment of a SPAD pixel.

FIG. 4 is a cross-section view schematically illustrating an embodiment of a SPAD pixel 20A. Pixel 20A comprises, like the pixel 20 described in relation with FIG. 2, a stack including: an upper level formed of SPAD circuit 102, or level 102; an intermediate level formed of quench circuit 104, or level 104; and a lower level formed of processing circuit 106, or level 106.

Level 106 comprises a substrate 200. Substrate 200 is preferably made of a semiconductor material, for example, of silicon. Transistors 202 are formed inside and on top of substrate 200. Transistors 202 are shown, in FIG. 4, by blocks resting on a surface 204 of substrate 200 and corresponding to the gates of transistors 202.

Circuit 106 is a digital circuit for processing the data generated by the SPAD. The electronic components comprised in circuit 106 are preferably mainly transistors, preferably exclusively transistors.

An insulating layer 206 covers surface 204 of substrate 200 and thus covers transistors 202. Conductive vias 207 cross layer 206.

A stack 208 of insulating layers covers layer 206. Conductive tracks 210 are located in stack 208, coupled to one another by conductive vias 212. Stack 208, as well as the conductive tracks 210 and the conductive vias 212, form an interconnection network enabling to interconnect the components of circuit 106, via vias 207.

Circuit 106 further comprises metal pads 214. The metal pads are located in stack 208, at the level of the upper surface of stack 208. In other words, the metal pads are located to be buried in stack 208, except for a surface of each pad flush with the upper surface of stack 208, that is, the surface most distant from substrate 200.

Preferably, at least certain pads 214 are coupled to conductive tracks 210 by conductive vias 212. Thus, electronic components, for example, transistors, may be coupled to elements external to circuit 106 via vias 207, the interconnection network, and pads 214.

Circuit 104 comprises a layer 223 comprising regions 224 made of a semiconductor material, for example, of silicon. Electronic components are formed inside and on top of semiconductor regions 224. In FIG. 4, although only transistors are shown inside and on top of regions 224, analog components other than transistors are formed in at least some of regions 224. Transistors 226 are located inside and on top of regions 224. More particularly, the transistors are formed in regions 224 and on a surface 228 of layer 223. Layer 223 further comprises regions 229 made of an insulating material separating regions 224 from one another. Layer 223 is thus formed of regions 224 and of regions 229.

Surface 228 of layer 223 is covered with an insulating layer 230. Layer 230 thus covers transistors 226 and other components, not shown, formed on surface 228. Conductive vias 232 cross layer 230.

The surface of layer 230 most distant from layer 223 is covered with an interconnection network, more particularly, by a stack 216 of insulating layers, of conductive tracks 218 located in stack 216, and of conductive vias 220 coupling the conductive tracks to one another and to the vias 232.

Circuit 104 further comprises metal pads 222 flush with the surface of the stack 216 most distant from regions 224.

Circuits 106 and 104 are bonded to each other by hybrid bonding. More particularly, stacks 208 and 216 are in contact with each other so that each pad 214 is in contact with a pad 222.

The surface of layer 223 opposite to surface 228 is covered with an insulating layer 227. Circuit 102 is bonded to layer 227. More particularly, circuit 102 is bonded to the surface of layer 227 opposite to the surface of the layer 227 in contact with layer 223.

Circuit 102 comprises a substrate 250. A SPAD 252 is formed in substrate 250. Preferably, SPAD 252 is in contact with circuit 104. Substrate 250 may for example comprise insulating walls, not shown.

Preferably, circuit 102 comprises a single SPAD 252. Preferably, circuit 102 comprises no other electronic components such as transistors, resistors, capacitors, etc. Possibly, optical filters or lenses, not shown, may be located on substrate 250.

Substrate 250, and more particularly SPAD 252, may be coupled to circuit 104, and more particularly to the interconnection network of circuit 104, by conductive vias 254. Vias 254 cross at least layers 227, 223, and 230, to reach, at the level of an end, a metal track 218. The other end of via 254 is for example flush with the surface of layer 227 in contact with circuit 102, to connect said metal track 218 to circuit 102, for example, to a terminal of the SPAD. Other vias 254, not shown, may extend in circuit 102, for example, to reach the other terminal of the SPAD.

Figure 5:
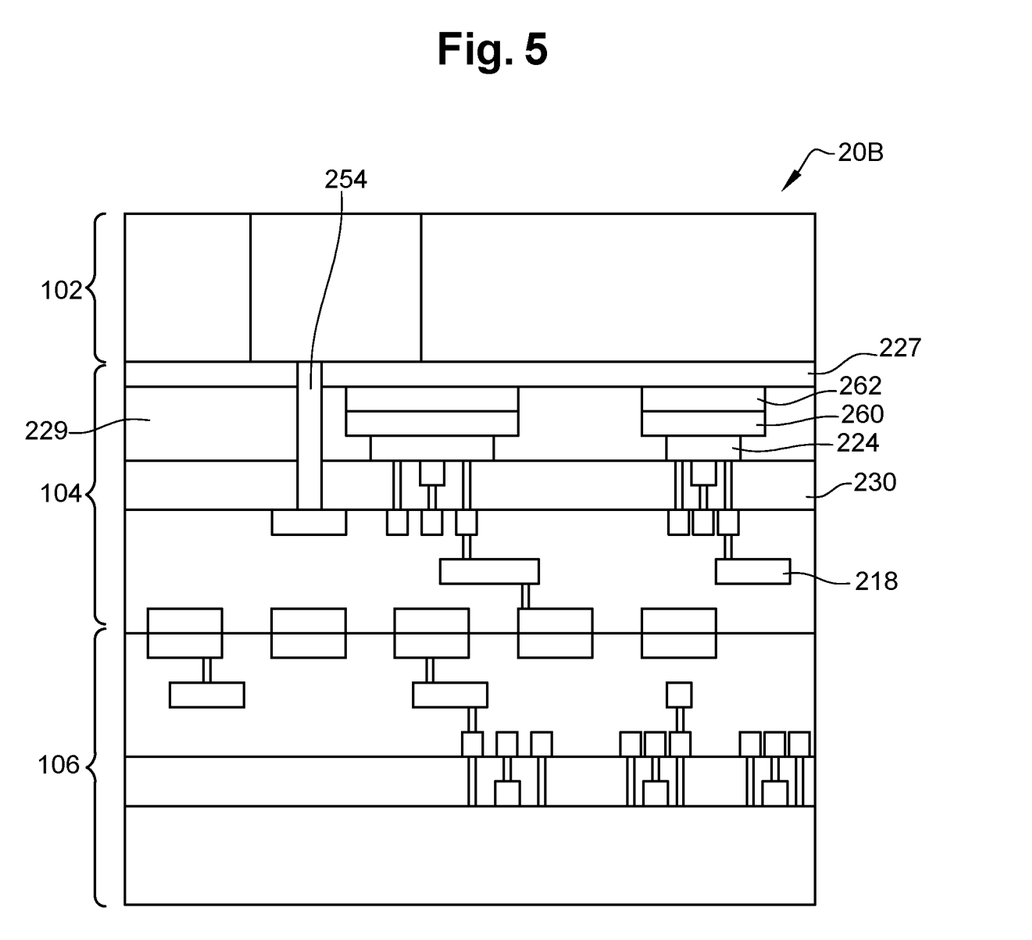
FIG. 5 is a cross-section view schematically illustrating another embodiment of a SPAD pixel.

FIG. 5 is a cross-section view schematically illustrating another embodiment of a SPAD pixel 20B.

Pixel 20B differs from pixel 20A in that each semiconductor region 224 is separated from layer 227 by an insulating region 260 and a ground plane 262. More particularly, a surface of region 224 rests on a surface of a region 260, for example, made of the same material as regions 229. The opposite surface of layer 260 rests on a conductive region 226, biased to ground. Region 262 rests on layer 227.

The regions 260 located opposite each region 224 are separated from one another by regions 229. Preferably, regions 260 and 262 have horizontal dimensions greater than the horizontal dimensions of regions 244 opposite which they are located.

Preferably, regions 262 are coupled to a node of application of a reference voltage, preferably the ground, via vias, not shown, coupling regions 262 to conductive tracks 218 of the interconnection network of circuit 104.

As a variant, at least certain layers 262 are separated from one another by regions 229. In other words, at least certain layers 262 are not separated from one another by regions 229. Preferably, at least certain layers 262 extend between regions 224 to be coupled together. Layers 262 are preferably coupled to ground.

Figure 6A:
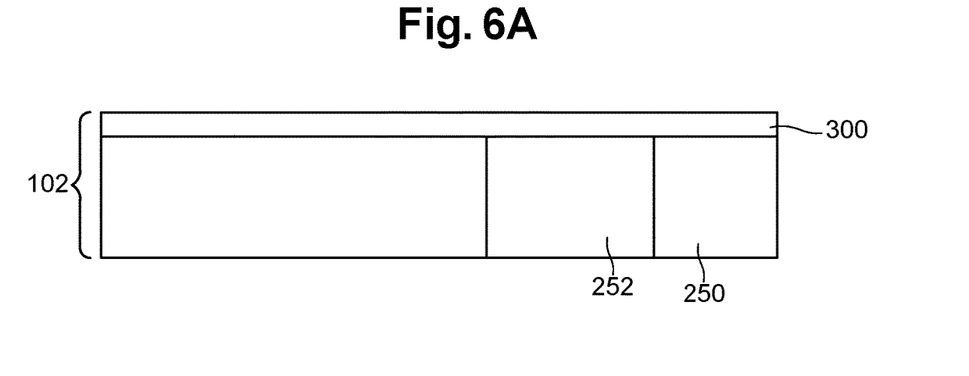
FIG. 6A shows a step of a method of manufacturing the embodiment of FIG. 5.
Figure 6B:
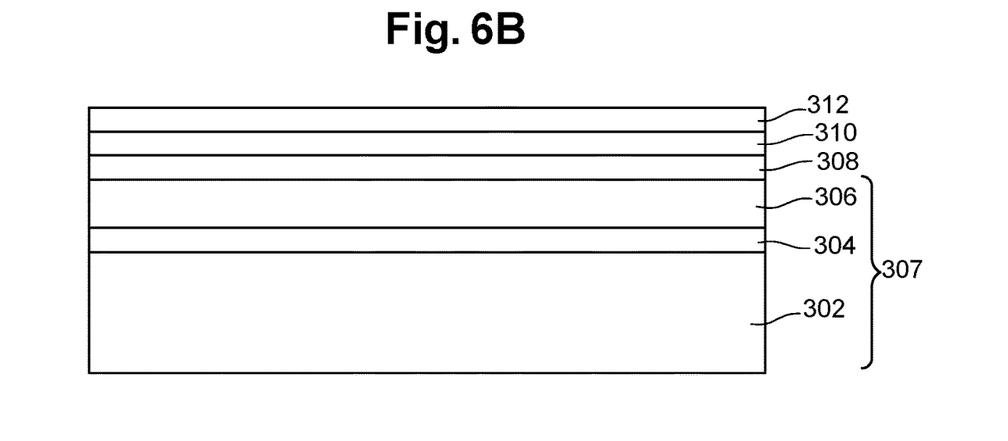
FIG. 6B shows another step of a method of manufacturing the embodiment of FIG. 5.
Figure 6C:
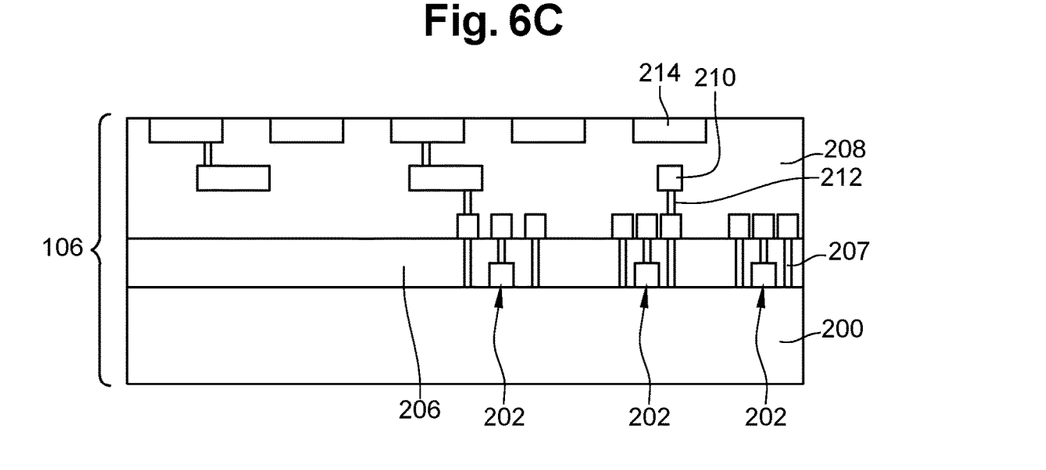
FIG. 6C shows another step of a method of manufacturing the embodiment of FIG. 5.

FIGS. 6A, 6B, and 6C show steps of the manufacturing of the pixel 20B of FIG. 5. More particularly, FIGS. 6A, 6B, and 6C are cross-section views along a vertical plane. These steps may be carried out one after the others or in parallel.

FIG. 6A shows a step of a method of manufacturing the embodiment of FIG. 5. More particularly, FIG. 6A shows the forming of circuit 102.

During this step, SPAD 252 is formed in substrate 250. The SPAD may be a vertical SPAD, that is, the PN junction of the SPAD has a vertical or horizontal direction, that is, the PN junction of the SPAD has a horizontal direction. The insulating walls, not shown, are formed in substrate 250.

Further, an insulating layer 300 is further formed on the substrate 250 surface which is intended to be closest to level 104. Preferably, layer 300 entirely covers said surface of the substrate.

Layer 300 is made of the material of layer 227. Layer 300 is for example made of silicon oxide. Layer 300 has a thickness smaller than layer 227.

Preferably, conductive vias, not shown, may also be formed, to couple the two opposite surfaces of the substrate 250.

FIG. 6B shows another step of a method of manufacturing the embodiment of FIG. 5. More particularly, FIG. 6B shows a step of forming of level 104.

The structure resulting from this step comprises a stack of layers having substantially the same horizontal dimensions, that is, the dimensions in top view. The structure comprises a semiconductor substrate 302, covered with an insulating layer 304, insulating layer 304 being covered with a layer 306 made of a semiconductor material, preferably the same material as substrate 302, for example, silicon. Substrate 302 and layers 304 and 306 form a structure 307 of semiconductor on insulator or SOI type. Layer 304 thus forms a layer of buried oxide or BOX type. Preferably, structure 307 is a structure of fully depleted semiconductor on insulator or FDSOI type. Layer 304 entirely covers substrate 302. Layer 306 entirely covers layer 304.

Layer 306 of semiconductor material is covered with an insulating layer 308. Insulating layer 308 entirely covers semiconductor layer 306.

Insulating layer 308 is covered with a conductive layer 310. Conductive layer 310 entirely covers insulating layer 308. Conductive layer 310 is preferably made of doped polysilicon.

Conductive layer 310 is covered with an insulating layer 312. Insulating layer 312 entirely covers conductive layer 310. Insulating layer 312 is preferably made of the same material as the layer 300 of FIG. 6A. The thickness of layer 312 is smaller than the thickness of the layer 227 of FIG. 5. The sum of the thicknesses of layers 300 (FIG. 6A) and 312 is substantially equal to the thickness of layer 227.

FIG. 6C shows another step of a method of manufacturing the embodiment of FIG. 5. More particularly, FIG. 6A shows the forming of circuit 106. Thus, FIG. 6C shows the forming of transistors 202 on substrate 200 and the forming of the interconnection network.

More particularly, the manufacturing step of FIG. 6C comprises: forming transistors 202 inside and on top of substrate 200; forming insulating layer 206 on substrate 200 and on transistors 202; forming vias 207 crossing layer 206 to reach, for example, the conduction and control terminals of transistors 202; forming of the interconnection network, comprising the forming of the insulating layers of stack 208, of conductive tracks 210, and of conductive vias 212; and forming of metal pads 214 adapted to a hybrid bonding, pads 214 flush with the upper surface of stack 208, that is, the surface most distant from substrate 200.

Figure 6D:
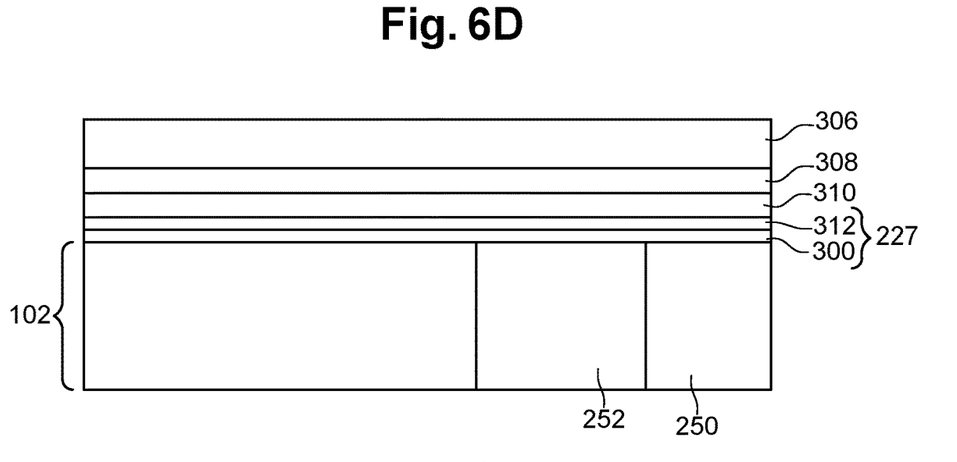
FIG. 6D shows another step of a method of manufacturing the embodiment of FIG. 5.
Figure 6E:
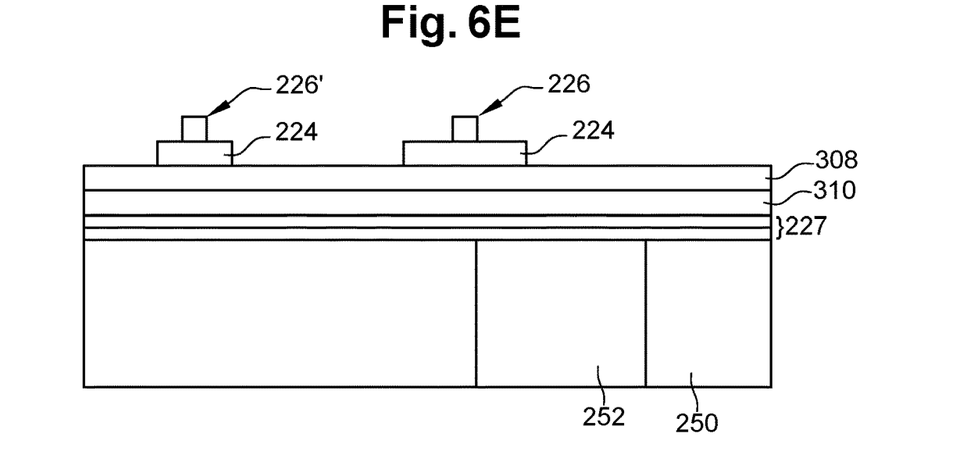
FIG. 6E shows another step of a method of manufacturing the embodiment of FIG. 5.
Figure 6F:
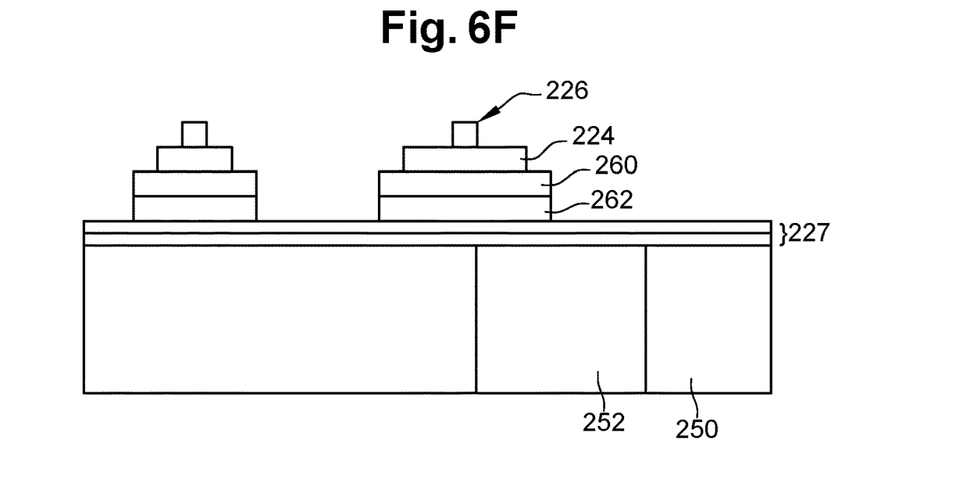
FIG. 6F shows another step of a method of manufacturing the embodiment of FIG. 5.

FIGS. 6D, 6E, 6F, 6G, and 6H show manufacturing steps, preferably successive, of the pixel 20B of FIG. 5. The steps of FIGS. 6D, 6E, 6F, 6G, and 6H are carried out after the steps of FIGS. 6A, 6B, and 6C. More particularly, FIGS. 6D, 6E, and 6F are cross-section views along a vertical plane.

FIG. 6D shows another step of a method of manufacturing the embodiment of FIG. 5.

During this step, the structure described in relation with FIG. 6B and the structure described in relation with FIG. 6A, that is, circuit 102, are bonded together by layers 300 and 312. More particularly, layers 300 and 312 are bonded together by molecular bonding. Layer 300 and layer 312 form the insulating layer 227 of FIG. 5.

The step of FIG. 6D further comprises the removal of layer 304 and of substrate 302 (FIG. 3B). Layer 302 thus forms a handle enabling to displace the structure of FIG. 6B before the fixation of the structure of FIG. 6A. Layer 304 thus forms an etch stop layer on removal of layer 302.

Before the bonding of the two structures during the step of FIG. 6D, no electronic component has been formed in layer 306. Preferably, no doping step has been carried out on layer 306. Thus, layer 306 is a uniform layer, made of a single material.

Further, no structuring step has been carried out on the layers of the structure of FIG. 6B. In other words, each of the layers of the structure of FIG. 6B preferably has a thickness substantially equal over its entire surface. No etch step has preferably been carried out to etch certain regions of one or a plurality of the layers of the structure of FIG. 6B and to avoid not to etch other regions of the same layer(s). Each of layers 300, 312, 310, 308, and 306 extends continuously opposite the assembly of substrate 250 and of the elements formed in substrate 250, such as the SPAD and, possibly, on the insulating walls, not shown.

FIG. 6E shows another step of a method of manufacturing the embodiment of FIG. 5.

During this step, layer 306 is etched to form semiconductor material regions 224. Preferably, only layer 306 is etched during this step. In particular, conductive layer 310 is preferably not etched during this step.

Further, the electronic components of circuit 104 are formed n regions 224. In FIG. 6E, two transistors 226 are shown, each being located inside and on top of a region 224. More generally, the different analog components forming the quench circuit are formed on regions 224. Thus, components, such as capacitors, resistors, etc. are formed inside and on top of regions 224.

The forming of the components after the bonding of the structures enables to ensure the proper alignment of the components. Indeed, the displacement of layer 306, during the bonding, may cause distortions of layer 306. Forming the components once layer 306 has been bonded to circuit 102 enables to avoid for such distortions to cause displacements among the components.

FIG. 6F shows another step of a method of manufacturing the embodiment of FIG. 5.

During this step, layers 308 and 310 are etched to form regions 260 and 262, located opposite regions 224. Preferably, each region 224 is located opposite a region 260 and a region 262, separated from regions 260 and 262 located opposite the other regions 224. Preferably, the horizontal dimensions of each region 262 are greater than the horizontal dimensions of region 224 opposite which said region 262 is located. Thus, at least a portion of each region 262 is not covered with the corresponding region 224.

Preferably, the horizontal dimensions of regions 260 are substantially equal to the horizontal dimensions of the regions 262 supporting them.

Figure 6G:
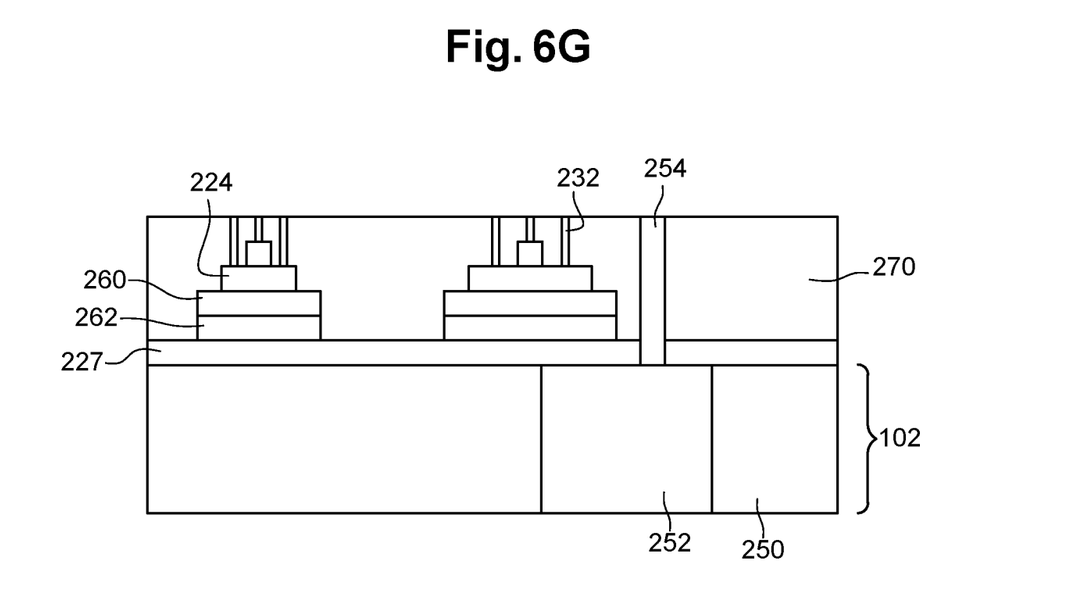
FIG. 6G shows another step of a method of manufacturing the embodiment of FIG. 5.

FIG. 6G shows another step of a method of manufacturing the embodiment of FIG. 5.

During this step, a layer 270 of an insulating material is formed on the structure of FIG. 6F. More particularly, layer 270 extends over the entire layer 227 and covers the stacks comprising regions 260, 262, 224, and the electronic components.

Conductive vias 254 and 232, for example, made of tungsten, are formed in layer 270. Vias 232 extend from the upper surface of layer 270, that is, the surface most remote from layer 227, and reach the components formed inside and on top of regions 224. Vias 254 extend through layer 270 and through layer 227 to reach circuit 102, for example, to reach a first terminal of the SPAD. Certain vias 254 may reach vias, not shown, having been previously formed in substrate 250 to be able to couple the upper surface of layer 270 to a second terminal of the SPAD.

Vias, not shown, may be formed to cross layer 270 and reach regions 262.

Figure 6H:
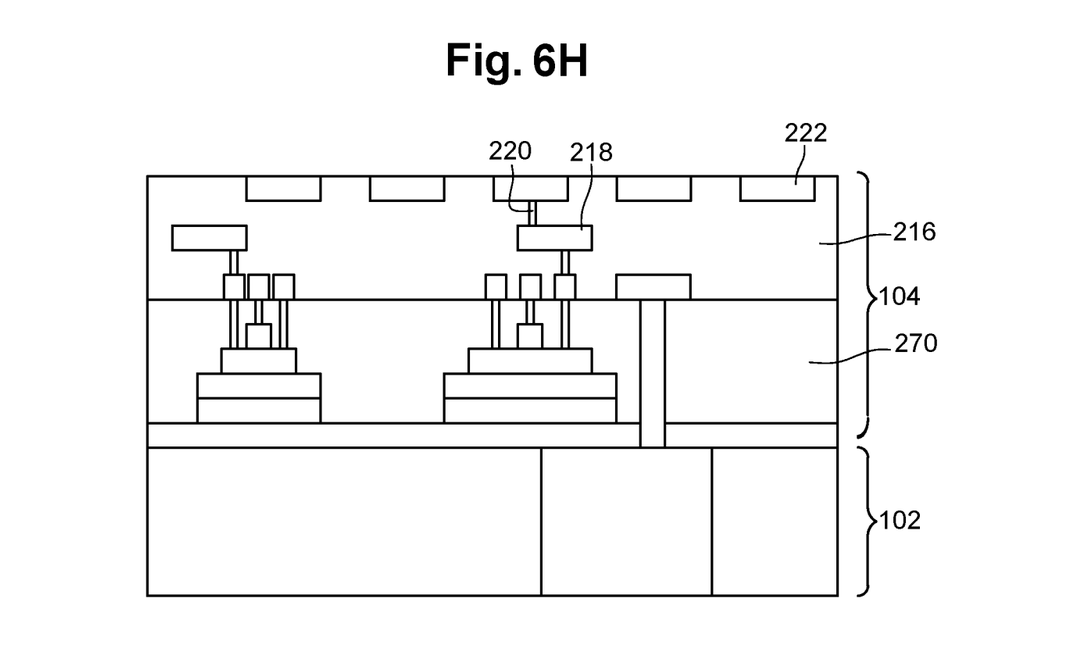
FIG. 6H shows another step of a method of manufacturing the embodiment of FIG. 5.

FIG. 6H shows another step of a method of manufacturing the embodiment of FIG. 5.

During this step, the interconnection network of circuit 104 is formed on layer 270. More particularly, the forming of the interconnection network comprises the forming of the insulating layers of stack 216, of conductive tracks 218, and of conductive vias 220. The step of FIG. 6H further comprises the forming of metal pads 222 adapted to hybrid bonding, flush with the upper surface of stack 216, that is, the surface most distant from layer 270.

During a step subsequent to the step of FIG. 6H, circuit 106, that is, the structure described in relation with FIG. 6C, is bonded to circuit 104, that is, to the structure described in relation with FIG. 6H. More particularly, the exposed surface of stack 208 of circuit 106 is bonded to the exposed surface of stack 216. In other words, the stack 216 of circuit 104 is bonded to the stack 208 of circuit 106. In other words, circuit 106 is bonded to circuit 104 by hybrid bonding, by the placing into contact of pads 214 of circuit 106 and pads 222 of circuit 104. The locations of pads 222 and 214 are preferably selected so that when circuits 104 and 106 are bonded to each other, each pad 222 is in contact with a pad 214.

An optical filter and/or lens forming step may for example be carried out during the step of FIG. 6A or after the step of FIG. 6H.

Various embodiments and variants have been described. Those skilled in the art will understand that certain features of these various embodiments and variants may be combined, and other variants will occur to those skilled in the art. In particular, layer 223, that is, regions 224 and regions 229, may be replaced with a single continuous layer made of a semiconductor material, extending all over layer 227, having all the components of circuit 104 formed therein.

In the embodiment of FIG. 5, the layer replacing layer 223 of the embodiment of FIG. 4 is separated from layer 227 by layers 310 and 308 which have not been etched. Indeed, during the manufacturing method, the steps of etching of layers 306, 308, and 310 are not carried out.

Finally, the practical implementation of the described embodiments and variations is within the abilities of those skilled in the art based on the functional indications given hereabove.

The invention claimed is:

1. A method of manufacturing a multi-level electronic device, comprising:
    forming a first level including a SPAD in a first semiconductor layer;
    molecular bonding a stack of layers to said first level, said stack of layers including a second semiconductor layer;
    processing said second semiconductor layer to form transistor devices for a quench circuit of a second level;
    covering the transistor devices of the quench circuit with a first insulating layer;
    forming a third level including a processing circuit in a third semiconductor layer; and
    hybrid bonding the third level to the first insulating layer of the second level.

2. The method of claim 1, wherein covering the transistor devices of the quench circuit with the first insulating layer further comprises forming first metal pads, wherein forming the third level comprises forming second metal pads in a second insulating layer, and where hybrid bonding comprises bonding the first and second insulating layers to each other and bonding the first and second metal pads to each other.

3. The method of claim 1, wherein processing said second semiconductor layer to form transistor devices comprises etching the second semiconductor layer to form a plurality of distinct semiconductor regions and providing at least one transistor device in each distinct semiconductor region.

4. The method of claim 1, wherein forming the first level comprises forming a third insulating layer covering the SPAD, wherein said stack of layers includes a fourth insulating layer, and wherein molecular bonding comprises bonding the third and fourth insulating layers to each other.

5. The method of claim 1, wherein the stack of layers comprises an SOI structure including a fifth insulating layer between the second semiconductor layer and a semiconductor support, the method further comprising, before processing said second semiconductor layer, removing the fifth insulating layer and the semiconductor support.

6. A method of manufacturing a multi-level electronic device, comprising:
    a) forming a first level including a first semiconductor layer and a first insulating layer;
    b) forming a stack of layers of a second level including a second semiconductor layer and a second insulating layer;
    c) bonding by molecular bonding the second insulating layer of said stack of layers to the first insulating layer;
    d) forming a first interconnection layer including first pads over the second semiconductor layer;
    e) forming a stack of layers of a third level including a third semiconductor layer and a second interconnection layer including second pads; and
    f) bonding by hybrid bonding the first and second interconnection layers and first and second pads.

7. The method of claim 6, wherein forming the first level comprises forming a SPAD in the first semiconductor layer, the method further comprising forming transistors for a quench circuit in the second semiconductor layer, and electrically connecting the quench circuit to the SPAD using vias passing through the molecularly bonded first and second insulating layers.

8. The method of claim 7, further comprising forming transistors for a processing circuit in the third semiconductor layer and wherein the first and second pads electrically connect the processing circuit to the quench circuit.

9. The method of claim 6, wherein the stack of layers of the second level comprises an SOI structure including a third insulating layer between the second semiconductor layer and a semiconductor support, the method further comprising, before forming the first interconnection layer, removing the third insulating layer and the semiconductor support.

10. An electronic device, comprising:
    a stack including a first level with a first semiconductor layer including a SPAD, a second level with a second semiconductor layer, different from the first semiconductor layer, including a quench circuit for said SPAD, and a third level with a third semiconductor layer, different from the first and second semiconductor layers, including a circuit for processing data generated by said SPAD;
    wherein the first level is bonded to the second level by molecular bonding and wherein the second level is bonded to the third level by hybrid bonding.

11. The device according to claim 10, wherein the first level comprises a single SPAD.

12. The device according to claim 10, wherein the first level comprises no electronic component other than the SPAD.

13. The device according to claim 10, wherein the second level only comprises said quench circuit.

* * * * *